(12) United States Patent
Anderson et al.

(10) Patent No.: US 10,312,346 B2
(45) Date of Patent: Jun. 4, 2019

(54) VERTICAL TRANSISTOR WITH VARIABLE GATE LENGTH

(71) Applicant: INTERNATIONAL BUSINESS MACHINES CORPORATION, Armonk, NY (US)

(72) Inventors: Brent A. Anderson, Jericho, VT (US); Bassem M. Hamieh, Albany, NY (US); Stuart A. Sieg, Albany, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/297,418

(22) Filed: Oct. 19, 2016

(65) Prior Publication Data

US 2018/0108754 A1    Apr. 19, 2018

(51) Int. Cl.
   *H01L 29/66*     (2006.01)
   *H01L 29/786*    (2006.01)
   *H01L 21/8234*   (2006.01)

(52) U.S. Cl.
   CPC .......... *H01L 29/66553* (2013.01); *H01L 21/823431* (2013.01); *H01L 29/6681* (2013.01); *H01L 29/66666* (2013.01); *H01L 29/78642* (2013.01); *H01L 29/78696* (2013.01)

(58) Field of Classification Search
   CPC ............... H01L 21/8232; H01L 29/66409
   See application file for complete search history.

(56) References Cited

U.S. PATENT DOCUMENTS

| | | | |
|---|---|---|---|
| 5,087,581 | A | 2/1992 | Rodder |
| 5,128,272 | A | 7/1992 | Ramde |
| 5,326,711 | A | 7/1994 | Malhi |
| 6,104,061 | A | 8/2000 | Forbes et al. |
| 6,150,210 | A | 11/2000 | Arnold |
| 6,194,773 | B1 | 2/2001 | Malhi |
| 7,560,728 | B2 | 7/2009 | Lin et al. |
| 7,683,428 | B2 | 3/2010 | Chidambarrao et al. |
| 7,791,068 | B2 | 9/2010 | Meng et al. |

(Continued)

FOREIGN PATENT DOCUMENTS

| | | |
|---|---|---|
| CA | 1271266 A | 7/1990 |
| WO | 02/086904 A3 | 10/2002 |

(Continued)

OTHER PUBLICATIONS

E. Memišević et al., "Thin electron beam defined hydrogen silsesquioxane spacers for vertical nanowire transistors," Journal of Vacuum Science & Technology B, vol. 32, No. 5, 2014, 051211, 6 pages, 2014 American Vacuum Society.

(Continued)

*Primary Examiner* — Cheung Lee
(74) *Attorney, Agent, or Firm* — Cantor Colburn LLP; Vazken Alexanian (57) ABSTRACT

A method includes forming a plurality of fins on a substrate. The method further includes forming a plurality of deep trenches in the substrate and interposed between each fin of the plurality of fins. The method further includes forming a doped semiconductor layer having a uniform thickness, wherein the doped semiconductor layer is formed prior to removing any fins of the plurality of fins.

4 Claims, 10 Drawing Sheets

(56) References Cited

U.S. PATENT DOCUMENTS

| | | | |
|---|---|---|---|
| 7,892,956 | B2 | 2/2011 | Deligianni et al. |
| 8,383,477 | B2 | 2/2013 | Lee |
| 8,471,310 | B2 | 6/2013 | Hynecek |
| 8,617,996 | B1 | 12/2013 | Chi et al. |
| 9,048,329 | B2 | 6/2015 | Kim et al. |
| 9,190,466 | B2 | 11/2015 | Basker et al. |
| 9,299,835 | B1 | 3/2016 | Anderson et al. |
| 2003/0015755 | A1 | 1/2003 | Hagemeyer |
| 2008/0197397 | A1 | 8/2008 | Parthasarathy et al. |
| 2009/0200604 | A1* | 8/2009 | Chidambarrao .. H01L 29/66787 257/329 |
| 2011/0006360 | A1 | 1/2011 | Ikebuchi |
| 2012/0091538 | A1* | 4/2012 | Lin ................... H01L 29/66795 257/401 |
| 2012/0214285 | A1 | 8/2012 | Guha et al. |
| 2013/0244387 | A1* | 9/2013 | Cho ................. H01L 21/76224 438/283 |
| 2014/0145242 | A1* | 5/2014 | Huang ............ H01L 21/823807 257/192 |
| 2014/0183641 | A1* | 7/2014 | Fan ................... H01L 29/66136 257/365 |

FOREIGN PATENT DOCUMENTS

| | | |
|---|---|---|
| WO | 2005091376 A1 | 9/2005 |
| WO | 2013123287 A1 | 8/2013 |

OTHER PUBLICATIONS

H. V. Mallela et al., "Vertical Field Effect Transistors With Metallic Source/Drain Regions," U.S. Appl. No. 15/140,763, filed Apr. 28, 2016.

K. Cheng et al., "Fabrication of Vertical Field Effect Transistor Structure With Controlled Gate Length," U.S. Appl. No. 15/087,074, filed Mar. 31, 2016.

V. D. Kunz et al., "Reduction of parasitic capacitance in vertical MOSFETs by spacer local oxidation," IEEE Transactions on Electron Devices, vol. 50, No. 6, 2003, pp. 1487-1493, IEEE.

* cited by examiner

Section A-A
FIG. 4

VERTICAL TRANSISTOR WITH VARIABLE GATE LENGTH

BACKGROUND

The present invention relates in general to semiconductor devices, and more specifically, to vertical-type transistors having bottom spacer uniformity and methods of fabricating the same.

As demands to reduce the dimensions of transistor devices continue, new designs and fabrication techniques to achieve a reduced device footprint are developed. Vertical-type transistors such as vertical field effect transistors (vertical FETs) have recently been developed to achieve a reduced FET device footprint. While some FET performance characteristics are improved in contemporary vertical FET designs, other FET device performance characteristics are often compromised.

SUMMARY

According to a non-limiting embodiment, a method of forming a vertical transistor is described. The method includes forming a plurality of fins on a substrate. The method further includes forming a plurality of deep trenches in the substrate and interposed between each fin of the plurality of fins. The method further includes forming a doped semiconductor layer having a uniform thickness, wherein the doped semiconductor layer is formed prior to removing any fins of the plurality of fins.

According to a non-limiting embodiment of the present invention, a vertical transistor includes a plurality of fins on a substrate, a plurality of deep trenches in the substrate and interposed between each fin of the plurality of fins, and a doped semiconductor layer having a uniform thickness. The doped semiconductor layer is formed prior to removing any fins of the plurality of fins.

Additional features are realized through the techniques of embodiments of the present invention. Other embodiments are described in detail herein and are considered a part of the claimed invention. For a better understanding of embodiments, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features of embodiments of the invention are apparent from the following detailed description taken in conjunction with non-limiting embodiments illustrated in the accompanying drawings. FIGS. 1-10 are a series of views illustrating a vertical FET device and a method of forming a vertical FET device according to exemplary embodiments of the present teachings, in which:

DETAILED DESCRIPTION

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the embodiments of the present invention are not intended to be limiting in this respect. Accordingly, a coupling of entities can refer to either a direct or an indirect coupling, and a positional relationship between entities can be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

For the sake of brevity, conventional techniques related to semiconductor device and IC fabrication can not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments will now be provided. Although specific fabrication operations used in implementing one or more embodiments can be individually known, the described combination of operations and/or resulting structures are unique. Thus, the unique combination of the operations described in connection with embodiments of the present invention utilizes a variety of individually known physical and chemical processes performed on a semiconductor (e.g., silicon) substrate. In general, the various processes used to form a micro-chip that will be packaged into an IC fall into three categories, namely, film deposition, patterning, etching, and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators, and selectively doped regions are built up to form the final device.

Turning now to an overview of technologies that are more specifically relevant to embodiments of the present invention, the finFET is a type of MOSFET. The finFET is a multiple-gate MOSFET device that mitigates the effects of short channels and reduces drain-induced barrier lowering. The word "fin" refers to a generally fin-shaped semiconductor structure patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length can be achieved in a given region of the substrate as opposed to a planar FET device.

The source/drain regions are often formed with a silicide material that is formed on a doped semiconductor material. A liner layer is often arranged on the silicide material, and a conductive contact is formed on the liner layer.

Device scaling in the semiconductor industry reduces costs, decreases power consumption and provides faster devices with increased functions per unit area. Improvements in optical lithography have played a major role in device scaling. However, optical lithography has limitations for minimum dimensions and pitch, which are determined by the wavelength of the irradiation.

In finFET devices, a conductive contact is formed over the source/drain regions to connect the finFET device to a circuit. The conductive contact is often formed by forming a trench in an insulator layer to expose the source/drain region. The trench is often formed using an etching process that can damage the underlying substrate while removing portions of the insulator layer.

The exposed substrate can be partially removed such that the planar surface of the substrate becomes gouged. Traces or remnants of polymer or nitrides can also remain on the surface of the substrate. The gouging and contaminates on the surface of the substrate are undesirable, and can result in increased contact resistance.

As previously noted herein, vertical-type transistors such as vertical FETs have recently been developed to achieve a reduced FET device footprint. While some FET performance characteristics are improved in contemporary vertical FET designs, other FET device performance characteristics are often compromised. A vertical FET has a channel perpendicular to the substrate surface as opposed to a conventional FET, which has a channel extending substantially parallel to the substrate surface. By forming the channel substantially perpendicular to the substrate surface, vertical FETs improve the device density beyond FET devices that have their channels positioned substantially parallel to the substrate surface. In a typical vertical transistor design, the bottom spacer sets the junction to channel. Conventional methods for forming the doped semiconductor layer uses a high-density plasma (HDP) chemical vapor deposition process to deposit a dielectric film (such as, for example, silicon nitride (SiN), low-K dielectric materials or oxide materials). The HDP process deposits the film thicker on the bottom surfaces and thin on the surfaces of the sides of the FINs. After deposition of the dielectric film, according to conventional methods, an isotropic etching process is performed to remove the film on fin sidewall.

With conventional methods, the HDP film deposition can have a pattern density loading effect that varies the thickness of the film layer between the fins. The deposited film thickness can vary according the pattern density, which can affect the device characteristics and control of other variable factors in the downstream manufacturing process. It would be beneficial to provide methods and devices having a fixed HDP bottom spacer thickness pattern that is density independent.

Turning now to an overview of aspects of the present invention, in one more embodiments the HDP bottom spacers are formed prior to cutting the fins. Because the fins are not yet cut when the bottom spacers are formed, the pattern density of the HDP deposition is uniform. After the HDP bottom spacer formation, the fins are cut, and the FET fabrication process is completed.

Figure 1:
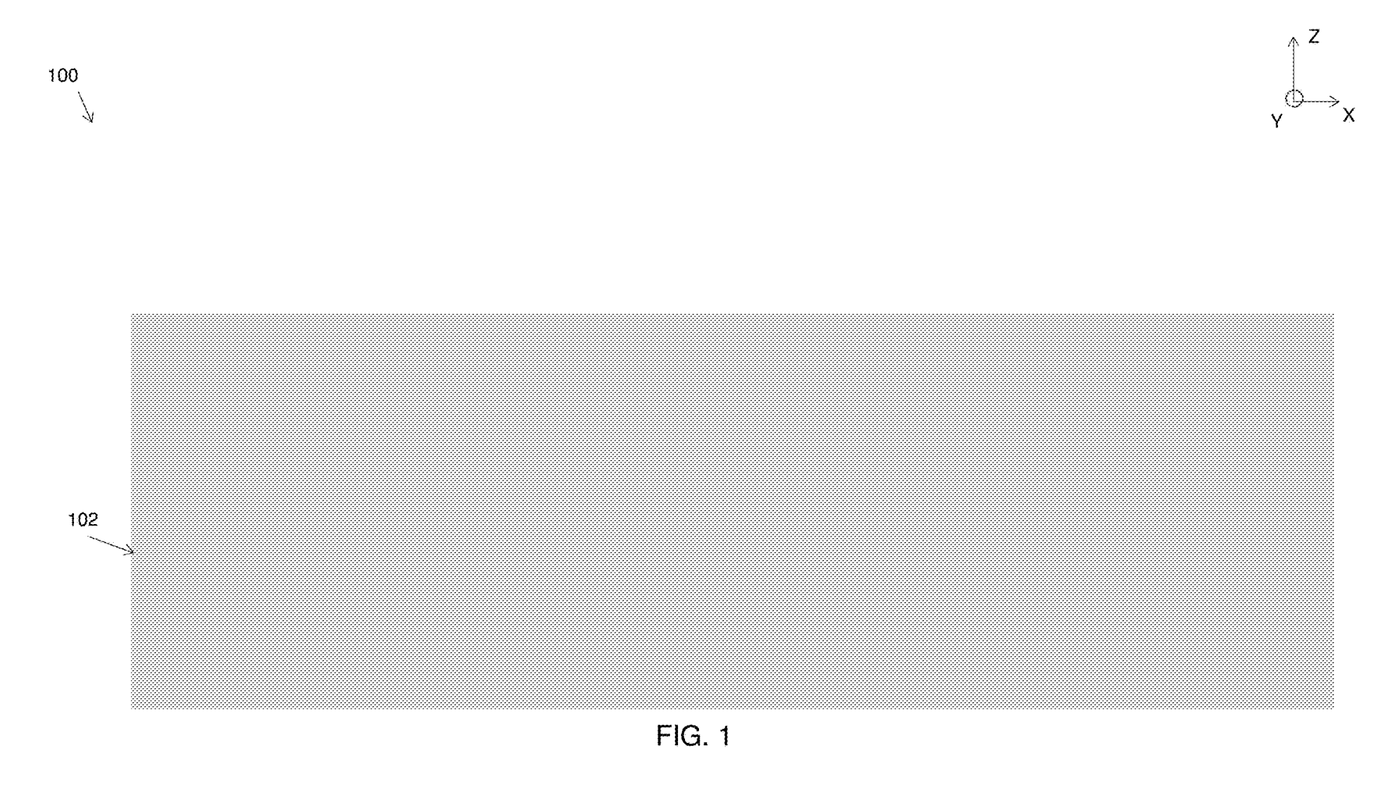
FIG. 1 is a cross-sectional view of a starting semiconductor structure having a semiconductor substrate according to a non-limiting embodiment.

Turning now to a more detailed description of one or more embodiments of the invention, with reference to FIG. 1, a starting semiconductor structure 100 for fabricating a vertical-type semiconductor device such as a vertical FET, for example, is illustrated according to a non-limiting embodiment. The starting semiconductor structure 100 extends along a first axis (e.g., a Z-axis) to define a vertical height, a second axis (e.g., an X-axis) to define a distance of a first side (i.e., a first side distance). A Y-axis arrow extends into the page, as shown in FIG. 1.

The starting semiconductor structure 100 includes a semiconductor substrate 102. The semiconductor substrate 102 can include a bulk semiconductor substrate or a semiconductor-on-insulator (SOI) substrate as understood by one of ordinary skill in the art. In one non-limiting embodiment, the material of the semiconductor substrate is silicon (Si). Other semiconductor substrates are also conceived. The semiconductor substrate 102 can include other structures (not shown) such as isolation, doped wells that can be formed by techniques well known in the art.

Non-limiting examples of suitable materials for the semiconductor substrate 102 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

Figure 2:
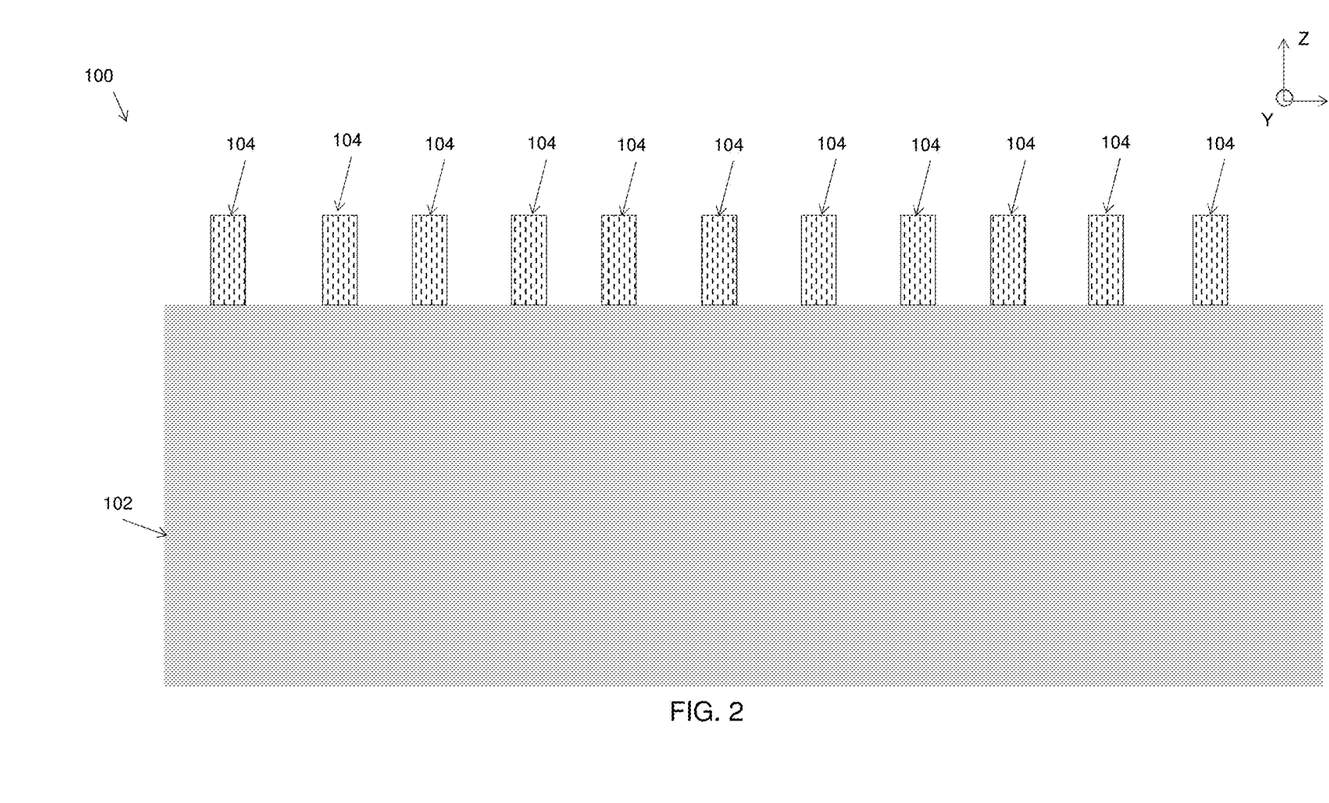
FIG. 2 illustrates the semiconductor structure of FIG. 1 after patterning hardmasks on an upper surface of the semiconductor substrate according to a non-limiting embodiment.
Figure 3:
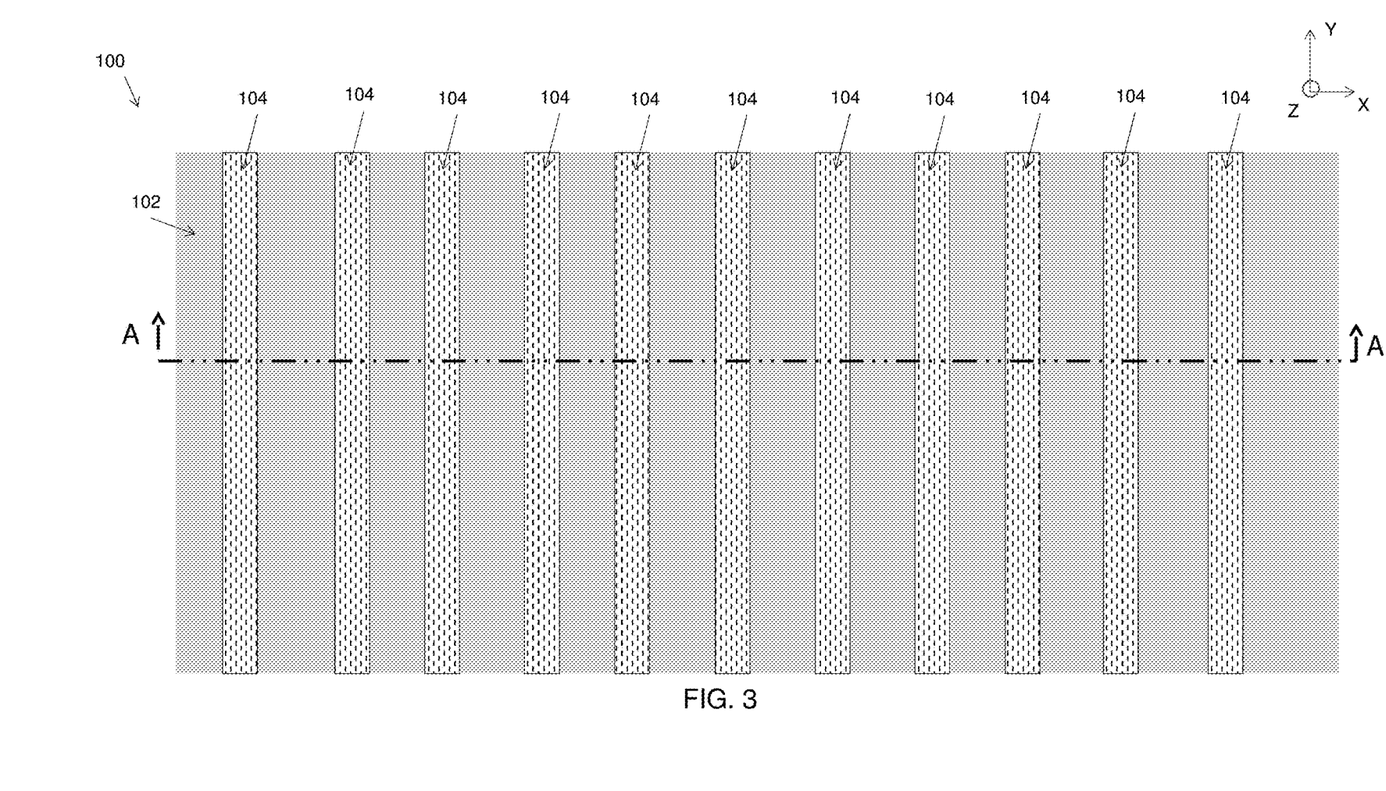
FIG. 3 illustrates a top view of the semiconductor structure of FIG. 2 after etching the deep trenches with an etching process according to a non-limiting embodiment.

Referring now to FIG. 2, the semiconductor structure 100 is illustrated after patterning and forming hardmasks 104 on an upper surface of the semiconductor substrate 102. The hardmasks 104 are formed by forming a masking layer on the upper surface of the semiconductor substrate 102. The masking layer can include a photosensitive material that is deposited using, for example, a spin coating process followed by photolithography. The masking layer can be, for example, a nitride hardmask. Alternatively, the masking layer can include a hardmask layer such as amorphous carbon. The hardmask 104 can further include, for example, silicon oxide, silicon nitride (SiN), SiOCN, SiBCN or any suitable combination of those. The hardmask 104 can be deposited using a deposition process, including, but not limited to, PVD, CVD, PECVD, or any combination thereof FIG. 3 illustrates a top view of semiconductor structure 100 after etching the deep trenches 119 with an etching process according to a non-limiting embodiment. Referring now to FIG. 3, where portions of semiconductor substrate 102 have been exposed by a pattern and selective etching technique to reopen deep trenches 119 around each of the fins 108. FIG. 8 depicts a section view of the semiconductor structure 100 shown in FIG. 7 taken along line A-A shown in FIG. 7. As best shown in FIG. 3, after patterning, a second etching process such as, for example, a reactive ion etching (RIE) process selective to a dielectric material 118 is performed. The etching process forms trenches in semiconductor substrate surface 102.

Figure 4:
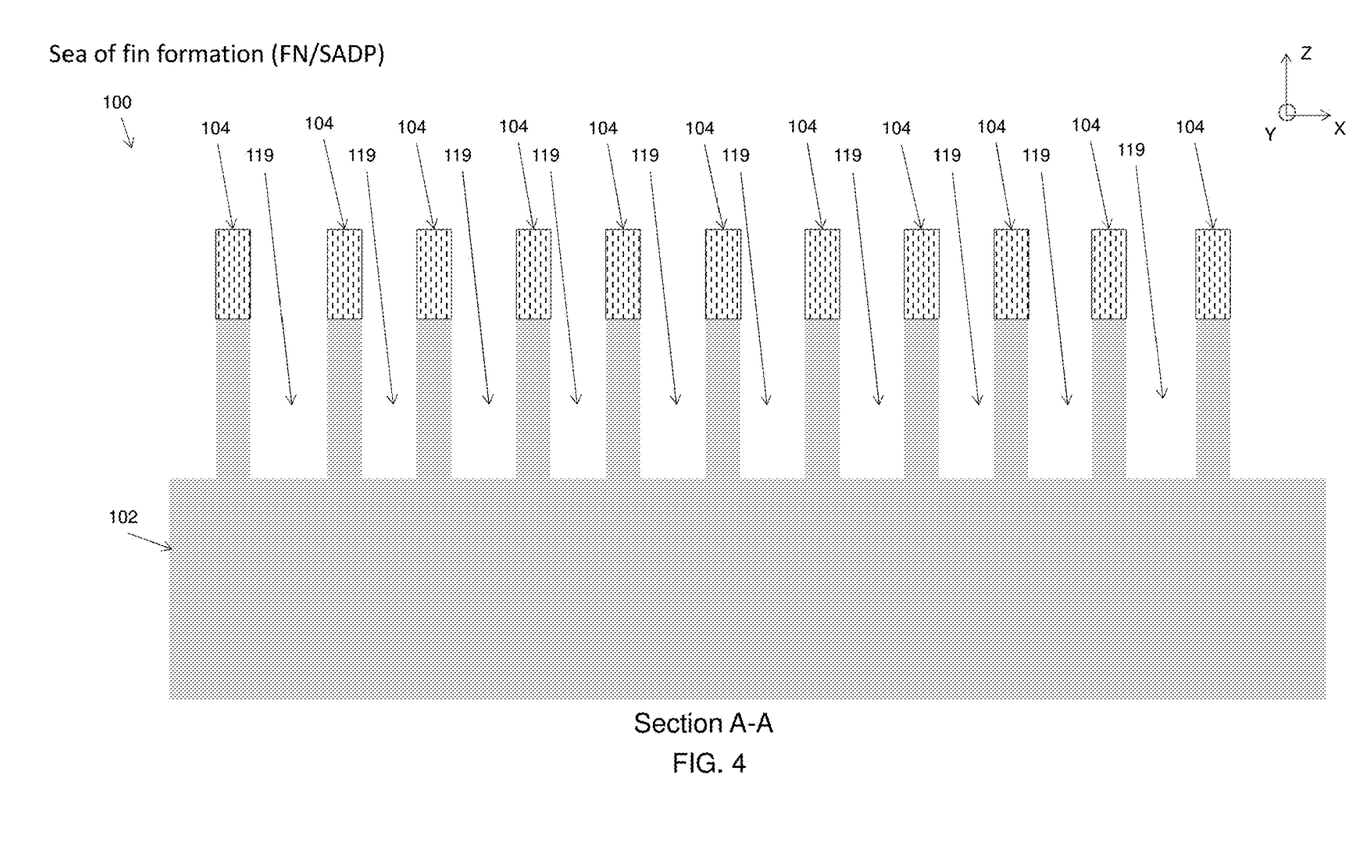
FIG. 4 illustrates a section view taken along A-A of the semiconductor structure of FIG. 3 after performing an etching process to transfer patterned trenches into the semiconductor substrate according to a non-limiting embodiment.

FIG. 4 illustrates a section view taken along A-A of semiconductor structure 100 after performing an etching process to transfer the patterned deep trenches 119 into semiconductor substrate 102, according to a non-limiting embodiment. In some aspects, the etching process forms a plurality of deep trenches 119 separating the plurality of fins. Hardmasks 104 remain at the top surface of the fins.

Figure 5:
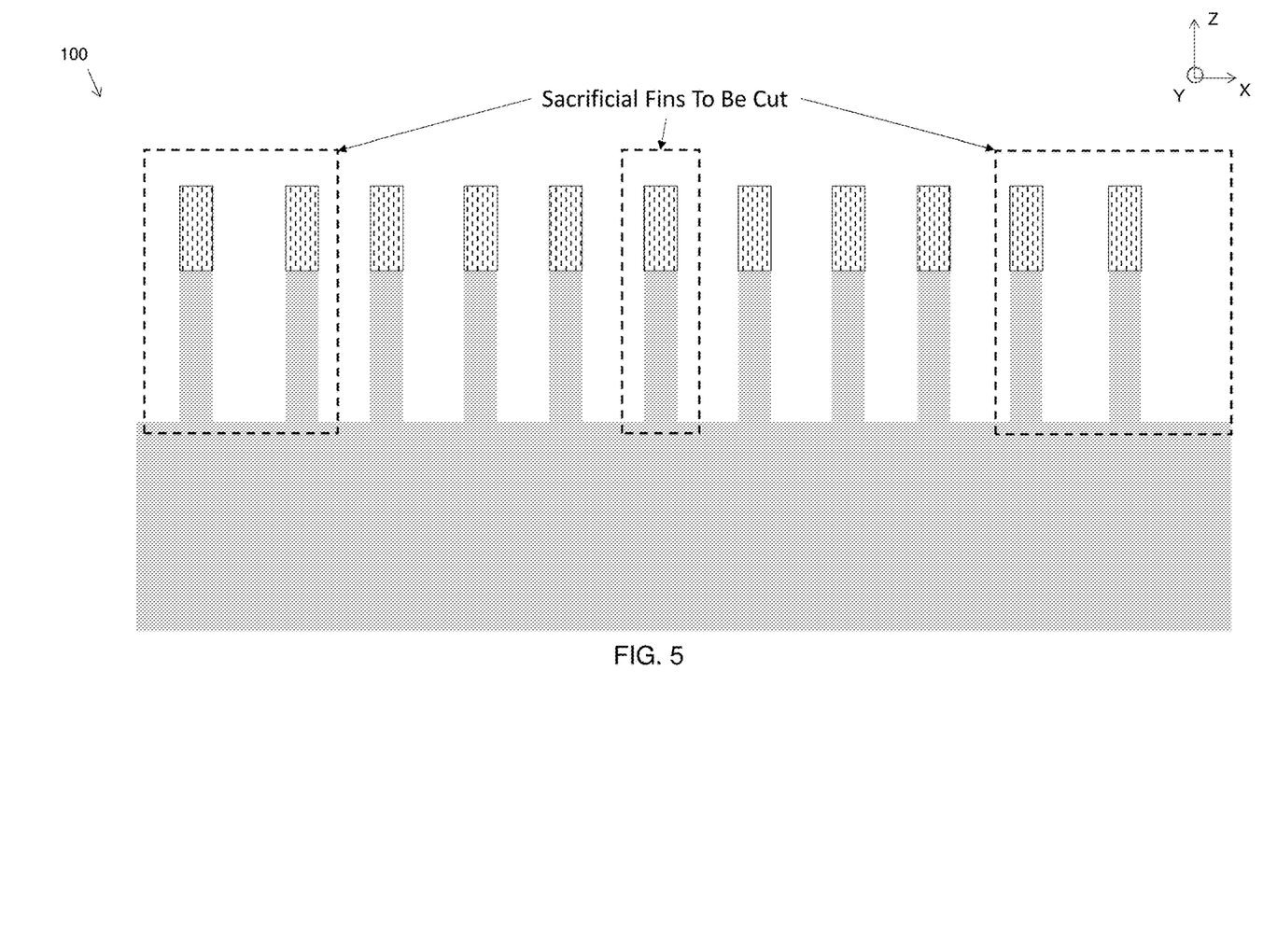
FIG. 5 illustrates the semiconductor structure of FIG. 4 having fins indicated for removal.

FIG. 5 illustrates semiconductor structure 100 showing sacrificial fins for removal. In some aspects, selected sacrificial fins can be removed after deposition of the dielectric material 124.

Figure 6:
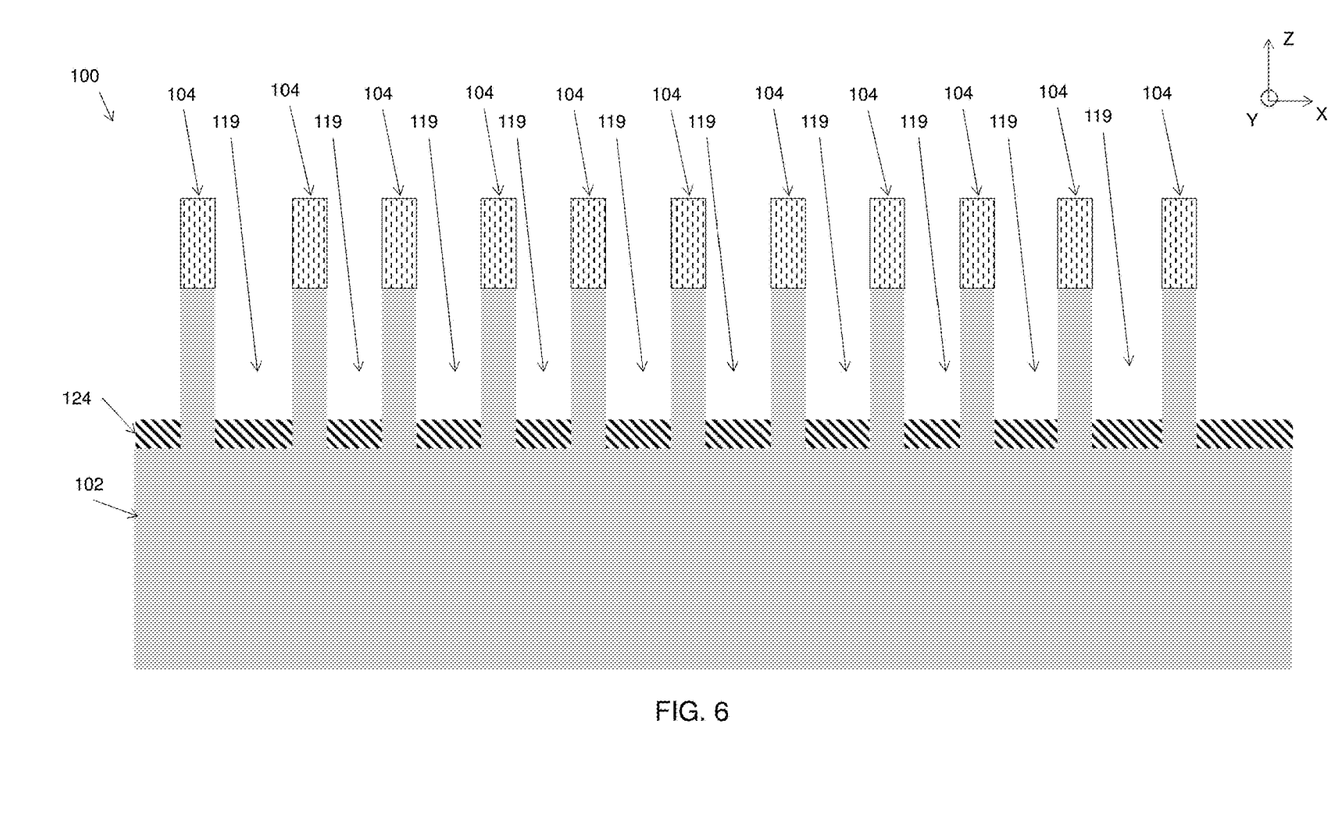
FIG. 6 illustrates the semiconductor structure of FIG. 5 following an epitaxial growth of a doped semiconductor layer having a uniform thickness in the deep trenches according to a non-limiting embodiment.

FIG. 6 illustrates semiconductor structure 100 following deposition of dielectric layer 124 having a uniform thickness in the deep trenches according to a non-limiting embodiment. Because the fins are not cut yet, pattern density of dielectric layer 124 is uniform everywhere on semiconductor 100, such as, for example, in deep trenches 119, so there is no pattern density impact for HDP deposition.

The dielectric material 124 deposited in the deep trenches 119 of the short region 110 and the long region 112 have substantially the same thickness although surfaces 120 and 122 are not coplanar. In one non-limiting embodiment, dielectric material 124 can be silicon dioxide (SiO2), silicon nitride (SiN) or SiBCN, or another oxide. For example, non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

According to one non-limiting embodiment, dielectric material 124 can have a vertical thickness ranging, for example, from approximately 2 nm to approximately 20 nm. According to one preferred embodiment, the dielectric material 124 has a thickness that varies by no more than 2 nm from one deep trench to the next deep trench. According to another non-limiting embodiment, dielectric material 124 has a thickness that varies by no more than 5 nm from one deep trench to the next deep trench Various epitaxial growth processes can be used to grow the dielectric material 124. For example, the dielectric material 124 can be epitaxially grown using chemical vapor deposition (CVD), liquid phase (LP) or reduced pressure chemical vapor deposition (RP-CVD), vapor-phase epitaxy (VPE), molecular-beam epitaxy (MBE), liquid-phase epitaxy (LPE), metal organic chemical vapor deposition (MOCVD), or other suitable processes. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $2\times1021$ cm$^{-3}$, or preferably between $2\times1020$ cm$^{-3}$ to $1\times1021$ cm$^{-3}$.

Figure 7:
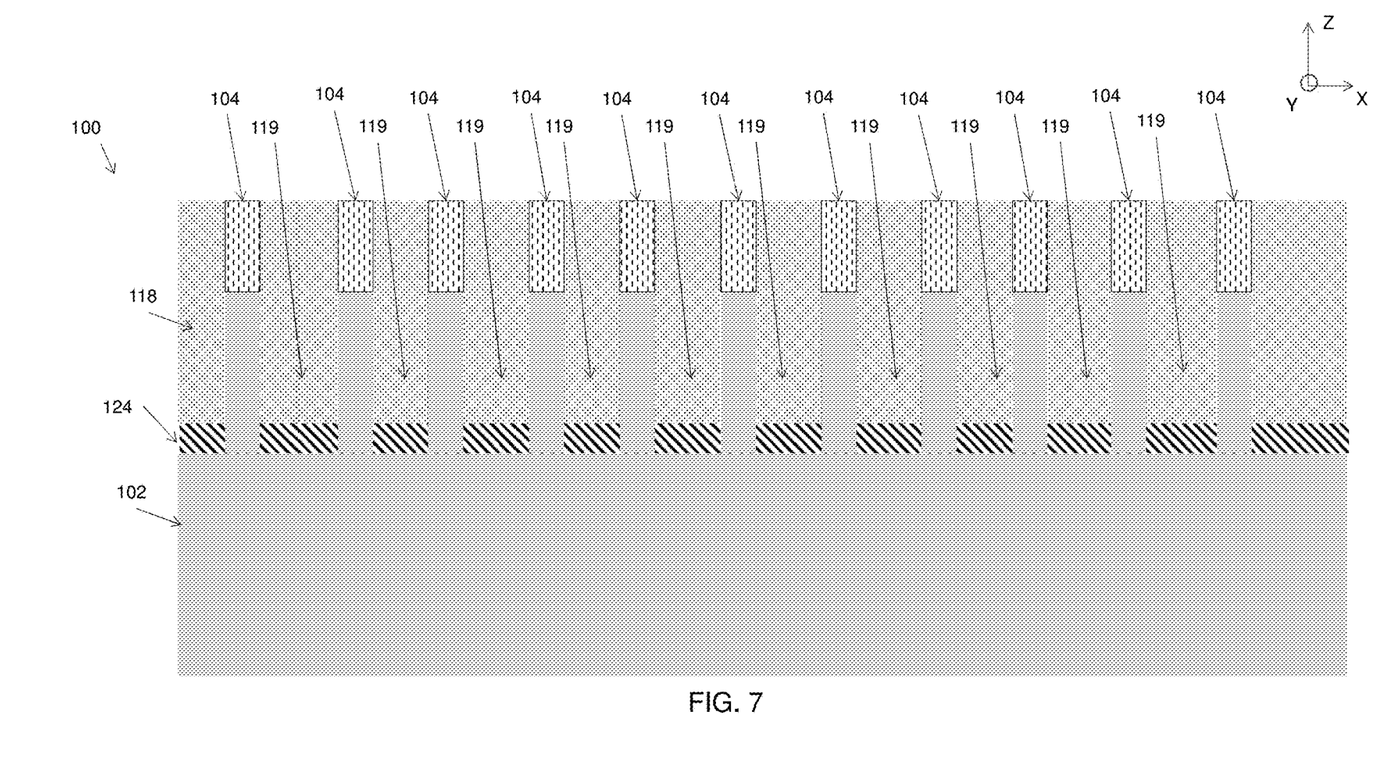
FIG. 7 illustrates the semiconductor structure of FIG. 6 having dielectric material deposited over the entire structure and planarized up to the top of hardmasks according to a non-limiting embodiment.
Figure 8:
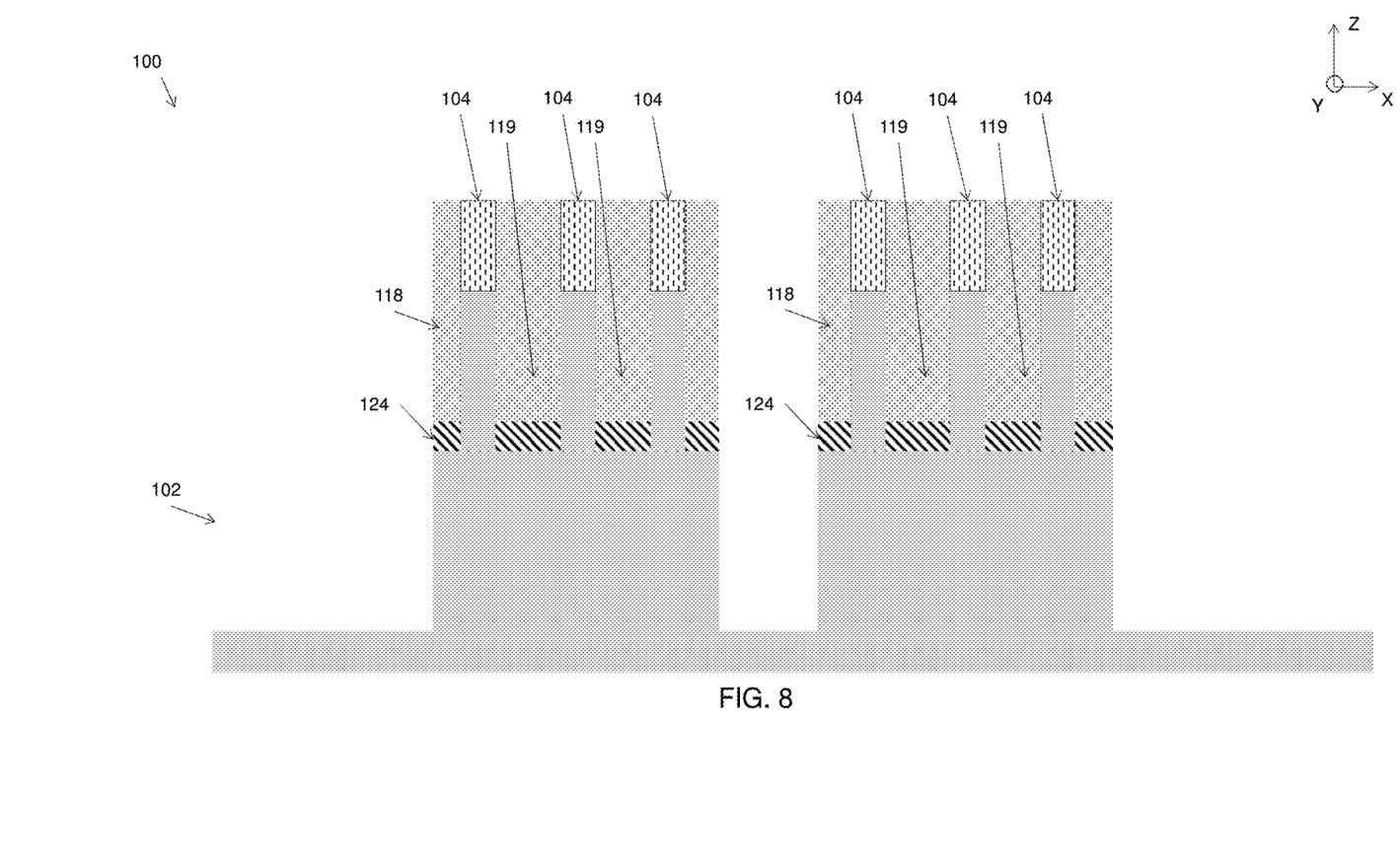
FIG. 8 illustrates the semiconductor of FIG. 7 after undergoing a patterned etching process to form deep trenches in between device regions according to a non-limiting embodiment.

FIG. 7 illustrates semiconductor structure 100 having a dielectric material 118 deposited over the entire structure and planarized up to the top of hardmasks 104, according to a non-limiting embodiment. As shown in FIG. 7, a dielectric material 118 (such as silicon dioxide) is deposited to fill the entire structure, including deep trenches 119. Dielectric material 118 is then recessed down to the hardmasks 104 using a technique such as chemical-mechanical planarization (CMP). The planarization is performed, at least, to the top surface of the hardmasks 104, exposing a distal surface of the hardmasks 104. In the illustrated embodiment, dielectric material 118 can form at least one isolation region that is a shallow trench isolation region ("STI"). However, the isolation region can be a trench isolation region, a field oxide isolation region (not shown), or any other type of isolation region. The isolation region provides isolation between neighboring gate structure regions, and can be used when the neighboring gates have opposite conductivities, e.g., nFETs and pFETs. As such, the isolation region can separate an nFET device region from a pFET device region.

FIG. 8 illustrates semiconductor structure 100 after undergoing a patterned etching process to form deep trenches in between device regions according to a non-limiting embodiment. After patterned etching, the sacrificial fins (identified in FIG. 5) are removed, forming deep trenches between individual semiconductor devices. The dielectric material 124, which functions as the bottom spacer, has uniform pattern density throughout the layer, because density was not impacted by deposition prior to removal of the sacrificial fins.

Figure 9:
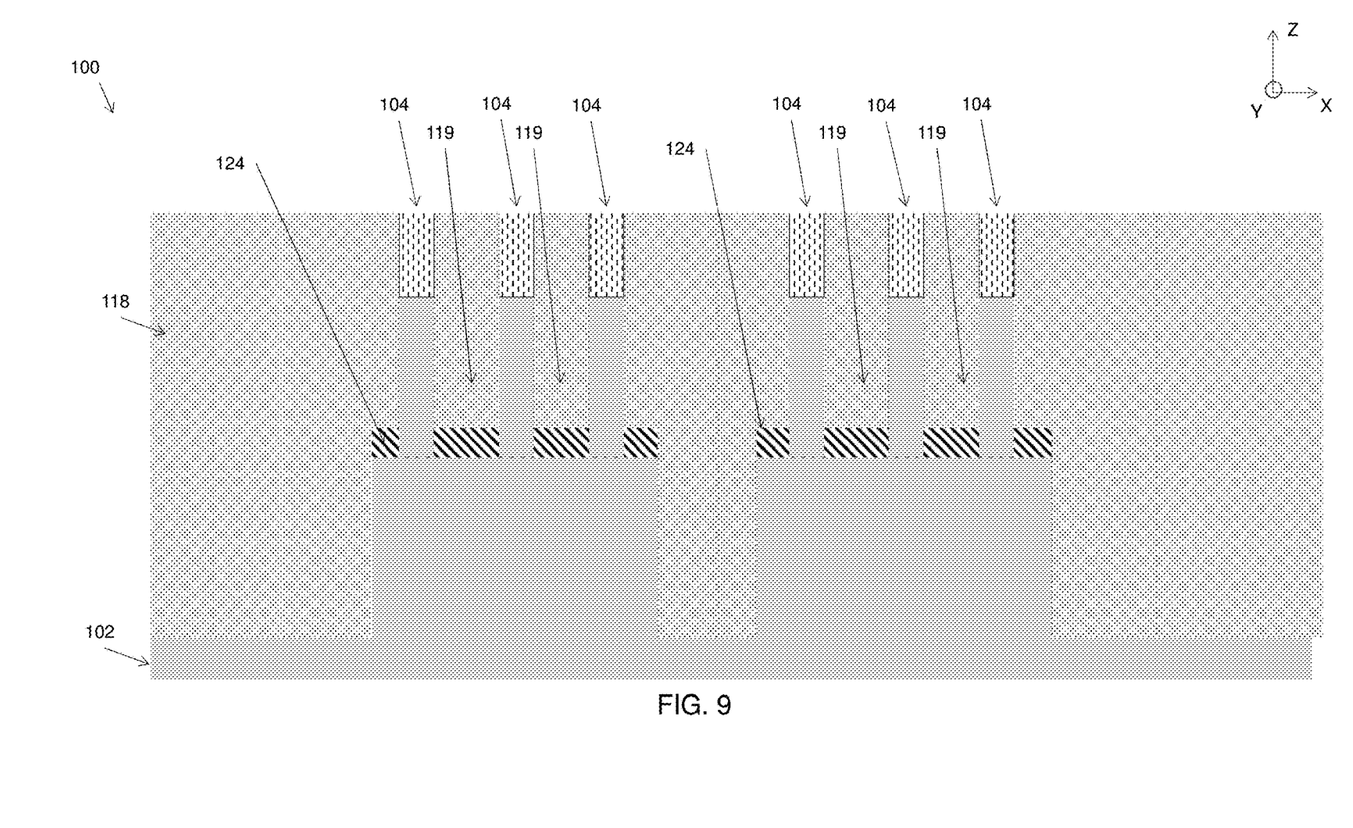
FIG. 9 illustrates the semiconductor structure of FIG. 8 having dielectric material deposited over the entire structure and planarized up to the top of hardmasks according to a non-limiting embodiment.

FIG. 9 illustrates semiconductor structure 100 having dielectric material deposited over the entire structure and planarized up to the top of hardmasks according to a non-limiting embodiment. In some aspects, dielectric material 118 is deposited and recessed using a CMP process to a top surface of hardmasks 104.

Figure 10:
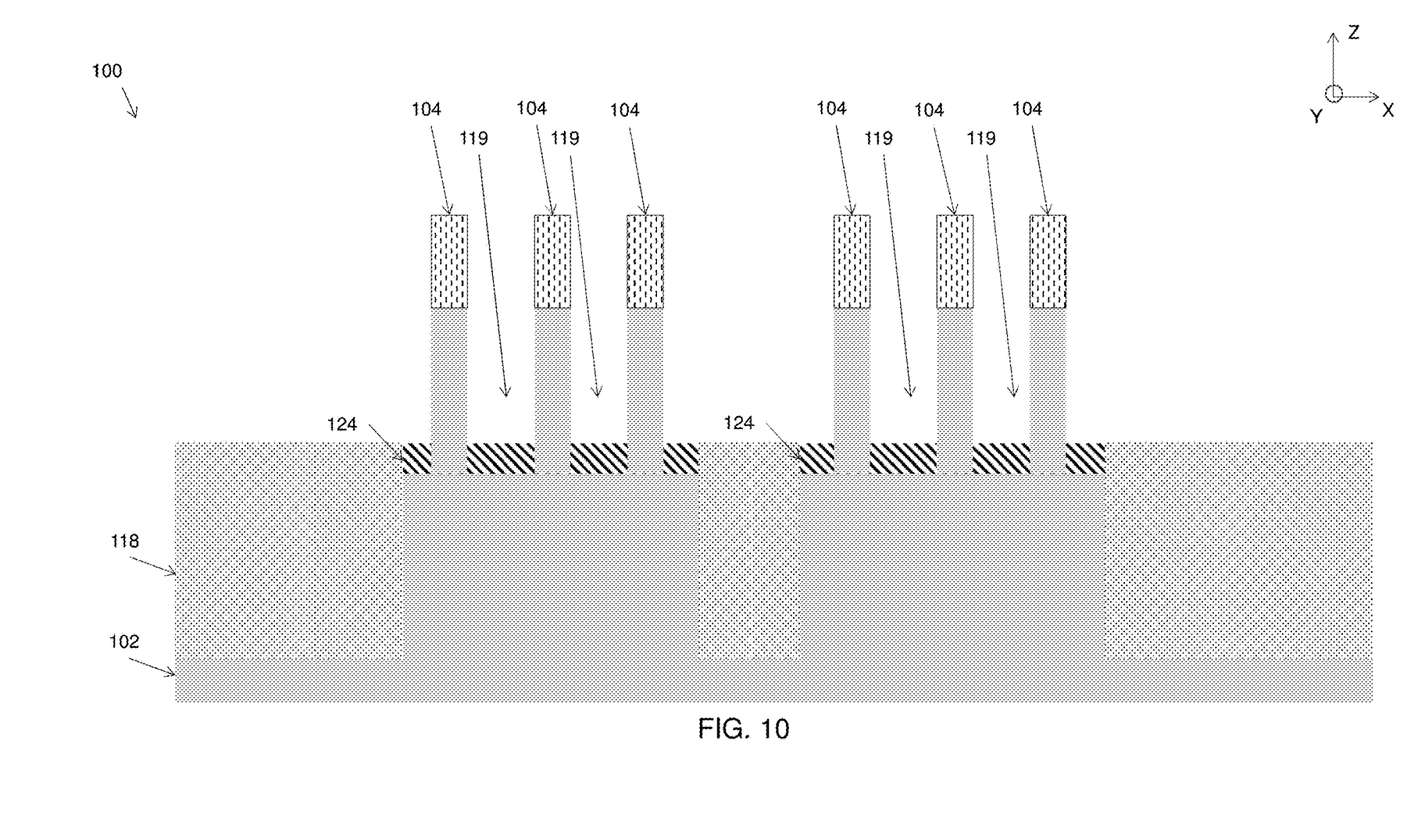
FIG. 10 illustrates the semiconductor structure of FIG. 9 following an etching process to bring the dielectric material planarized to the top of the doped semiconductor layer according to a non-limiting embodiment.

FIG. 10 illustrates semiconductor structure 100 following an etching process to bring dielectric material 118 to the top of the dielectric material 124 with a planarization technique, according to a non-limiting embodiment.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments described herein.

What is claimed is:

1. A method of forming a vertical transistor, the method comprising of:
    patterning a hardmask layer on a semiconductor substrate;
    transferring the patterned hardmask layer into the semiconductor substrate, wherein transferring comprises etching a plurality of trenches into the semiconductor substrate to define a plurality of fins at a constant pattern density, the plurality of fins comprising dummy fins;
    forming a bottom spacer layer without having to remove the patterned hardmask layer, wherein the bottom spacer layer has a uniform thickness between the plurality of fins, wherein the bottom spacer layer comprises silicon nitride (SiN);
    forming an oxide layer on the bottom spacer layer to a top surface of the patterned hardmask layer on the plurality of fins;
    removing the dummy fins and forming a plurality of deep trenches into the semiconductor substrate at locations of the dummy fins, wherein removing the dummy fins provides the plurality of fins with a variable pattern density; and
    depositing a dielectric material to a top surface of the patterned hardmask layer on the plurality of fins and etching the dielectric material to a top surface of the bottom space layer and form isolation regions of the dielectric material in each of the plurality of deep trenches.

2. The method of claim 1, wherein the bottom spacer layer is deposited by a high-density plasma (HDP) film deposition process.

3. The method of claim 1, wherein the bottom spacer layer is deposited with a thickness tolerance less than or equal to 5 nm.

4. The method of claim 1, wherein the patterned hardmask layer is transferred with a reactive ion etching (RIE) process.

* * * * *